May 27, 1969 J. E. TOFFLER 3,446,996
DELAY EQUALIZER CIRCUIT WHEREIN THE OUTPUT SIGNAL
PHASE IS DEPENDENT UPON THE
INPUT SIGNAL FREQUENCY
Filed April 21, 1966

Jerome E. Toffler,
INVENTOR.
BY.
J. K. Haskell
ATTORNEY.

United States Patent Office 3,446,996
Patented May 27, 1969

3,446,996

DELAY EQUALIZER CIRCUIT WHEREIN THE OUTPUT SIGNAL PHASE IS DEPENDENT UPON THE INPUT SIGNAL FREQUENCY

Jerome E. Toffler, Anaheim, Calif., assignor to Hughes Aircraft Company, Culver City, Calif., a corporation of Delaware Filed Apr. 21, 1966, Ser. No. 545,795
Int. Cl. H03k 5/20
U.S. Cl. 307—233 3 Claims

ABSTRACT OF THE DISCLOSURE

In the disclosed delay equalizer circuit, input signals are applied via a resistive path to an inverting input terminal of an operational amplifier and are applied via a frequency sensitive path including a band-stop filter to a noninverting input terminal of the operational amplifier. The operational amplifier output voltage has substantially the same amplitude as the circuit input voltage but varies in phase relative to the input voltage as a function of frequency depending upon the relative voltages passed through the resistive and the frequency sensitive paths.

Figure 2:
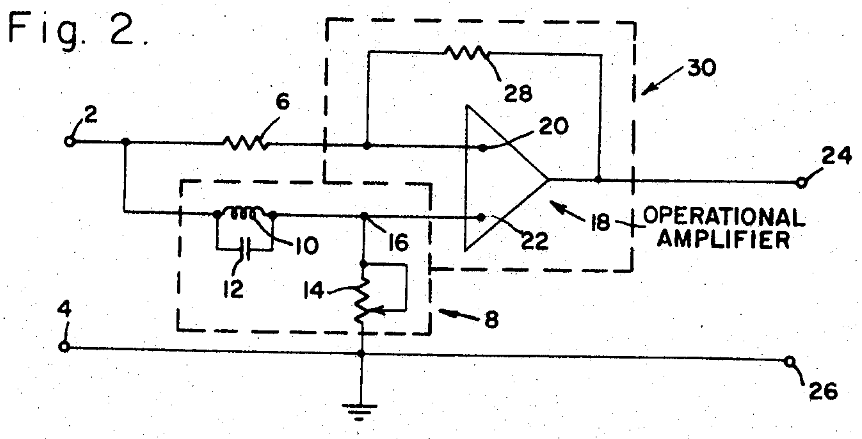

This invention relates to delay equalizer circuits.

Facsimile, high-speed telegraphy, and pulse modulated data transmission are extremely vulnerable to envelope delay distortion. To compensate for this in carrier systems and associated equipment, delay equalizers are used. Such equalizers have an essentially frequency-independent amplitude characteristic throughout the useful frequency range and a frequency-dependent delay characteristic complementary to that of the transmission line or other utilization device whose compensation is desired. A typical delay equalizer consists of a number of sections in series, each of which inserts a predetermined delay at a selected frequency. In this connection it should be noted that other delay networks are known having a flat or frequency-independent delay characteristic, but these are not usable as delay equalizers.

One disadvantage of conventional delay equalizers has been that each section has required a heavy, bulky input transformer and a large coupling capacitor to operate properly at audio frequencies. This requirement is particularly disadvantageous where a number of sections have been needed to make up a single delay equalizer.

A principal object of this invention, therefore, is to provide an improved delay equalizer circuit.

Another object of this invention is to provide a delay equalizer circuit with direct input coupling.

A further object of this invention is to provide a delay equalizer circuit operable at audio frequencies without large coupling capacitors or input transformers.

An additional object of this invention is to provide a delay equalizer circuit which obviates the need for input transformers and large coupling capacitors by utilizing an operational amplifier.

A still further object of this invention is to provide a delay equalizer circuit comprising an integrated circuit type of operational amplifier.

Briefly, these objectives are achieved in accordance with this invention by providing a delay equalizer circuit comprising direct coupling signal input means; impedance means with first and second elements coupled to the signal input means, the first element being adapted to transmit input voltage signals of all frequencies in a predetermined range and the second element being adapted to transmit input voltage signals of all frequencies except a predetermined narrow band in the predetermined range; and servo means, incuding operational amplifier means with inverting and noninverting input means and with output means, the inverting and noninverting input means being respectively coupled to the first and second elements, and including feedback means coupled between the output means and the inverting input means, for providing output voltage signals of substantially the same amplitude as the input voltage signals but gradually varying in phase relative to the input voltage signals as a function of signal frequency.

Figure 1:
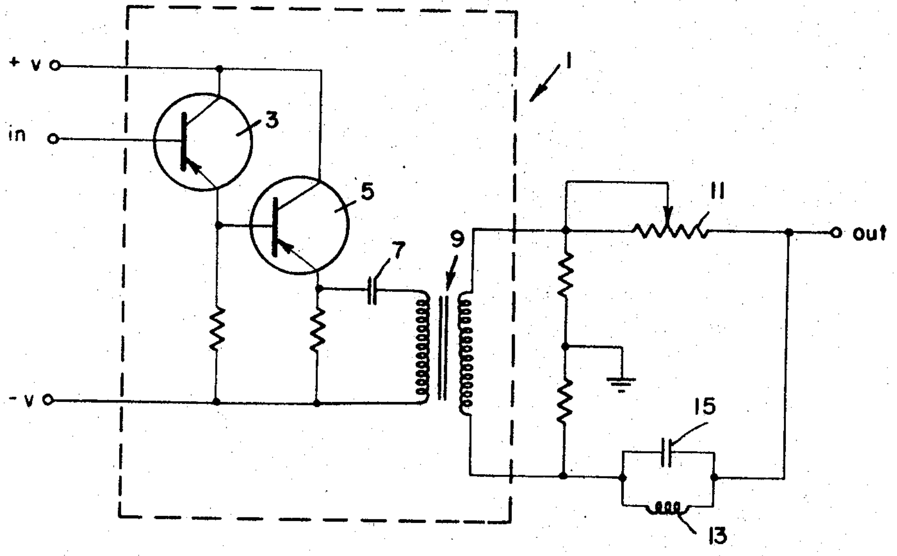
Fig. 1. PRIOR ART

The invention will be more fully described hereinafter by way of example and with reference to the accompanying drawing wherein:

FIG. 1 is a schematic diagram showing a conventional delay equalizer circuit; and FIG. 2 is a schematic diagram showing a delay equalizer circuit according to the invention, an operational amplifier comprised therein, however, being shown in block form.

Referring now to FIG. 1, a conventional delay equalizer circuit is shown comprising an input coupling section 1, including two transistors 3, 5 arranged as a Darlington pair, a coupling capacitor 7, and an input transformer 9.

By way of contrast, FIG. 2 shows a delay equalizer circuit according to the invention, comprising direct coupling signal input means including first and second signal input terminals 2, 4, the second one 4 being coupled to a level of reference voltage, in this case ground. Coupled to the first signal input terminal 2 are impedance means including first and second elements, the first element comprising a resistor 6, and the second element comprising a band-stop filter 8. Such a filter may include an inductor 10 and a capacitor 12 in parallel and coupled thereto in series, a resistor 14 which may be a potentiometer. The resistor 14 is coupled to the second signal input terminal 4 at the end most remote from the junction 16 between the inductor 10, the capacitor 12, and the resistor 14.

Included in the delay equalizer circuit is an operational amplifier 18 with inverting input means including an inverting input terminal 20 and noninverting input means including a noninverting input terminal 22. The inverting input terminal 20 is coupled to the resistor 6, and the noninverting terminal 22 is coupled to the junction 16. The operational amplifier 18 also has an output terminal 24 which serves as (or is coupled to) an output terminal for the delay equalizer circuit as a whole. The delay equalizer circuit also has another output terminal 26 coupled to the voltage reference source, ground.

Coupled between the output terminal 24 and the inverting input terminal 20 is a feedback means, in this case a resistor 28 of the same value as the resistor 6. This completes the servo means 30.

With respect to operation, it can be shown that both the conventional circuit of FIG. 1 and the inventive circuit of FIG. 2 have the same transfer function:

$$\frac{E\text{ out}}{E\text{ in}}=\frac{R-jX}{R+jX}$$

where R is the resistance of either potentiometer 11 (or 14) and X is the net reactance of the associated tank circuit comprised of an inductor 13 (or 10) and capacitor 15 (or 12) in parallel. Hence, when the delay equalizer of the invention is energized with voltage signals having a frequency range in the operational range of the operational amplifier 18, the output voltage is inverted with respect to the input voltage in the narrow band of frequencies stopped by the band-stop filter 8, i.e. frequencies in the immediate vicinity of the resonant frequency of inductor 10 and capacitor 12. At other frequencies in the operational range, the phase of the output voltage varies gradually as a function of frequency (in accordance with the above equation) and assumes various values with respect to the phase of the input voltage depending upon the relative voltages passed by the resistor 6 and the filter 8, the amplitude of the output voltage being substantially equal to that of the input voltage.

It will be appreciated that FIG. 2 shows only the preferred embodiment of the invention and that alternative embodiments are included within the scope of the invention. For example, the band-stop filter 8 could be replaced by an arrangement comprising a series inductor-capacitor combination resonant at the same frequency as the parallel inductor-capacitor combination 10, 12, the series combination being coupled between the junction 16 and ground, and the resistor 14 being coupled instead between the first input terminal 2 and the junction 16.

There has thus been shown a novel delay equalizer circuit comprising an operational amplifier and feedback means obviating the need for input transformers and coupling capacitors, a factor of considerable advantage where a number of such circuits must be used in series to make a single delay equalizer.

What is claimed is:

1. A delay equalizer circuit comprising: a circuit input terminal; an operational amplifier having a noninverting input terminal, an inverting input terminal, an output terminal, and a feedback impedance element coupled between said output terminal and said inverting input terminal; a frequency insensitive signal path coupled between said circuit input terminal and said inverting input terminal and providing an impedance essentially equal to that of said feedback impedance element; and a frequency sensitive signal path including a band-stop filter coupled between said circuit input terminal and said noninverting input terminal.

2. A delay equalizer circuit comprising. a circuit input terminal; an operational amplifier having a noninverting input terminal, an inverting input terminal, an output terminal, and a feedback resistor coupled between said output terminal and said inverting input terminal; a resistor coupled between said circuit input terminal and said inverting input terminal and providing a resistance essentially equal to that of said feedback resistor; and a frequency sensitive impedance network including a band-stop filter coupled between said circuit input terminal and said noninverting input terminal.

3. A delay equalizer circuit comprising: a circuit input terminal; a reference terminal; an operational amplifier having a noninverting input terminal, an inverting input terminal, an output terminal, and a feedback resistor coupled between said output terminal and said inverting input terminal; a resistor coupled between said circuit input terminal and said inverting input terminal and providing a resistance essentially equal to that of said feedback resistor; a band-stop filter including an inductor and a capacitor coupled in parallel between said circuit input terminal and said noninverting input terminal; and a variable resistance device coupled between said noninverting input terminal and said reference terminal.

References Cited

UNITED STATES PATENTS

| | | | |
|---|---|---|---|
| 3,148,285 | 9/1964 | Tedeschi et al. ---- | 328—155 X |
| 3,281,705 | 10/1966 | Frye --------------- | 330—30 |

HERMAN KARL SAALBACH, *Primary Examiner.*

PAUL L. GENSLER, *Assistant Examiner.*

U.S. Cl. X.R.

178—69; 323—125; 328—140; 333—28